(12) United States Patent
Huang et al.

(10) Patent No.: US 9,564,393 B1
(45) Date of Patent: Feb. 7, 2017

(54) SEMICONDUCTOR DEVICE PACKAGE AND METHOD OF MAKING THE SAME

(71) Applicant: Advanced Semiconductor Engineering, Inc., Kaohsiung (TW)

(72) Inventors: Chih-Yi Huang, Kaohsiung (TW); Kuo-Hua Chen, Kaohsiung (TW); Chi-Tsung Chiu, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/857,931

(22) Filed: Sep. 18, 2015

(51) Int. Cl.
*H01L 23/00* (2006.01)
*H01L 23/498* (2006.01)
*H01L 21/52* (2006.01)
*H01L 21/768* (2006.01)

(52) U.S. Cl.
CPC ......... *H01L 23/49844* (2013.01); *H01L 21/52* (2013.01); *H01L 21/76802* (2013.01); *H01L 21/76877* (2013.01); *H01L 23/49811* (2013.01); *H01L 23/49827* (2013.01)

(58) Field of Classification Search
CPC ...................................................... H01L 23/48
See application file for complete search history.

(56) References Cited

U.S. PATENT DOCUMENTS

| 8,637,341 | B2 | 1/2014 | Otremba et al. |
| 2010/0078783 | A1* | 4/2010 | Otremba ............. H01L 23/5389 257/676 |

* cited by examiner

*Primary Examiner* — William Harriston
(74) *Attorney, Agent, or Firm* — Foley & Lardner LLP; Cliff Z. Liu

(57) ABSTRACT

A semiconductor device package includes a substrate and a semiconductor device disposed on a surface of the substrate. The semiconductor device includes a first contact pad and a second contact pad disposed on an upper surface of the semiconductor device. The semiconductor device package further includes a conductive bar disposed on the first contact pad, and a conductive pillar disposed on the second contact pad. A method of making a semiconductor device package includes (a) providing a substrate; (b) mounting a semiconductor device on the substrate, wherein the semiconductor device comprises a first contact pad and a second contact pad on an upper surface of the semiconductor device; (c) forming a dielectric layer on the substrate to cover the semiconductor device; (d) exposing the second contact pad by forming a hole in the dielectric layer; and (e) applying a conductive material over the dielectric layer and filling the hole.

20 Claims, 5 Drawing Sheets

SEMICONDUCTOR DEVICE PACKAGE AND METHOD OF MAKING THE SAME

BACKGROUND

1. Technical Field

The present disclosure relates generally to semiconductor device packages and method of making the same. More particularly, the present disclosure relates to high power semiconductor device packages.

2. Description of the Related Art

Semiconductor device packaging has continued to receive a significant amount of attention from designers and manufacturers of electronic products. This attention is based upon the market demand for products with greater efficiency, higher performance, and smaller dimensions.

High power semiconductor device present additional challenges in packaging since the resistance of the main current paths (including pads, contacts and traces) of the package should be carefully controlled in order to avoid reduction in efficiency or excessive heating. High power semiconductor devices may include devices such as field effect transistors (FETs), metal oxide semiconductor FETs (MOSFETs), insulated gate FETs (IGFETs), thyristors, bipolar transistors, diodes, MOS-controlled thyristors, and resistors. Further characteristics of high power semiconductor devices may include an ability to switch or conduct large currents, a vertical current flow from one side of the semiconductor device to the other side of the semiconductor device, and/or active pads or contacts on both the top and bottom surfaces of the semiconductor device.

It is against this background that a need arose to develop the semiconductor device packages and related methods described herein.

SUMMARY

A semiconductor device package includes a substrate and a semiconductor device disposed on a surface of the substrate. The semiconductor device includes a first contact pad and a second contact pad disposed on an upper surface of the semiconductor device. The semiconductor device package further includes a conductive bar disposed on the first contact pad, and a conductive pillar disposed on the second contact pad.

A semiconductor device package includes a substrate and a semiconductor device disposed on a surface of the substrate. The semiconductor device includes a first contact pad having a first surface area and disposed on an upper surface of the semiconductor device, and a second contact pad having a second surface area and disposed on the upper surface of the semiconductor device. The first surface area is greater than the second surface area. The semiconductor device package further includes multiple conductive pillars disposed on the first contact pad and a conductive pillar disposed on the second contact pad.

A method of making a semiconductor device package includes (a) providing a substrate; (b) mounting a semiconductor device on the substrate, wherein the semiconductor device comprises a first contact pad and a second contact pad on an upper surface of the semiconductor device; (c) forming a dielectric layer on the substrate to cover the semiconductor device; (d) exposing the second contact pad by forming a hole in the dielectric layer; and (e) applying a conductive material over the dielectric layer and filling the hole.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
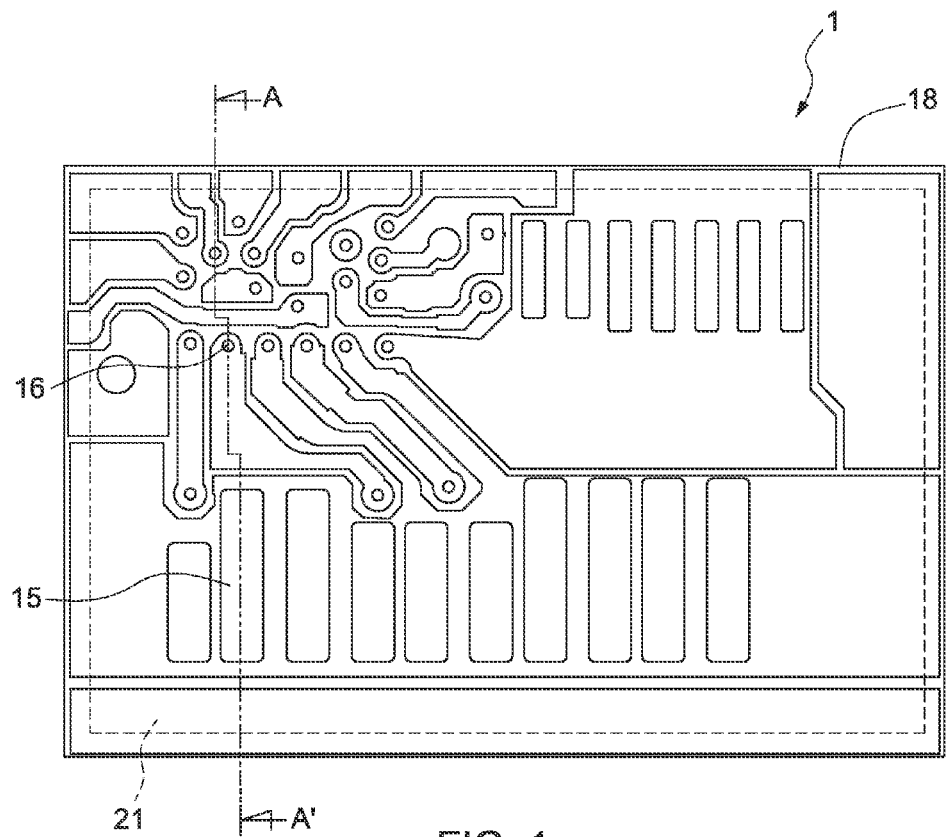
FIG. 1 illustrates a top view of the semiconductor device package in accordance with an embodiment of the present disclosure.
Figure 2:
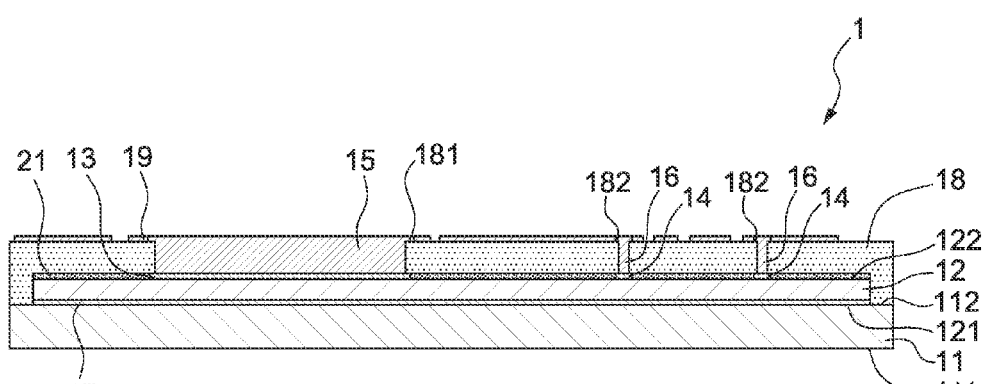
FIG. 2 illustrates a cross-sectional view of the semiconductor device package shown in FIG. 1.

FIG. 1 illustrates a top view of a semiconductor device package 1 in accordance with an embodiment of the present disclosure. FIG. 2 illustrates a cross-sectional view of the semiconductor device package 1 across line AA' of FIG. 1. Referring to FIGS. 1 and 2, the semiconductor device package 1 includes a substrate 11, a semiconductor device 12, an insulating layer 21, contact pads 13, 14, 17, conductive bars 15, conductive pillars 16, a dielectric layer 18 and a patterned conductive layer 19.

The substrate 11 has a surface 111 and a surface 112 opposite the surface 111. The substrate 11 may be a monocrystalline silicon substrate, a polycrystalline silicon substrate, an amorphous silicon substrate, a microcrystalline silicon substrate or a substrate made of another suitable material. The substrate 11 may be a supporting substrate (core substrate) for mounting a number of chips or dies thereon. The substrate 11 may be formed of an insulating material (such as a resin).

The semiconductor device 12 is disposed on the surface 112 of the substrate 11. The semiconductor device 12 has a surface 121 and a surface 122 opposite the surface 121 of the semiconductor device 12. The surface 121 of the semiconductor device 12 is adjacent to the surface 112 of the substrate 11. The contact pads 13 and 14 are disposed on the surface 122 of the semiconductor device 12. The contact pad 17 is disposed on the surface 121 of the semiconductor device 12. The contact pad 17 may contact the surface 112 of the substrate 11.

The semiconductor device 12 may include a semiconductor chip or die with circuits integrated therein. The semiconductor device 12 may have a vertical structure which allows electrical current to flow from the surface 121 to the surface 122, and vice versa. The semiconductor device 12 has contact elements (e.g., contact pads 13, 14 and 17) on both sides of the semiconductor device 12. The semiconductor device 12 may include a power transistor (e.g., a MOSFET) or a power diode (e.g., a Schottky diode). As a power transistor, a drain/source terminal may be disposed on one side of the semiconductor device 12 (e.g., surface 122)

and a gate terminal may be disposed on the other side of the semiconductor device 12 (e.g., surface 121). As a power diode, an anode terminal may be disposed on one side of the semiconductor device 12 (e.g., surface 122) and a cathode terminal may be disposed on the other side of the semiconductor device 12 (e.g., surface 121).

The contact pads 13, 14 and 17 may include copper (Cu), aluminum (Al), gold (Au) or another suitable conductive material, metal or alloy. In one or more embodiments, the contact pads 14 are electrically connected to a gate terminal of a power transistor in the semiconductor device 12, for transmitting an approximately 1 milliamp (mA) to 2 mA current signal (which may be a control signal or an input/output signal). In one or more embodiments, the contact pad 13 is electrically connected to one of a drain terminal or a source terminal of a power transistor in the semiconductor device 12, and the contact pad 17 is electrically connected to the other of the drain terminal or the source terminal of the power transmitter; in such embodiments, the contact pads 13 and 17 are capable of transmitting an approximately 10 A to 100 A current signal, and in some embodiments, the current signal is a power signal or a ground signal. The contact pad 17 may contact a corresponding pad (not shown in FIG. 1 and FIG. 2) on the surface 112 of the substrate 11.

A surface area of the contact pad 13 is relatively greater than a surface area of any one of the contact pads 14. In one or more embodiments of the present disclosure, the surface area of the contact pad 13 is at least approximately ten times greater than the surface area of any one of the contact pads 14, such as at least approximately 15 times greater or at least approximately 20 times greater. The insulating layer 21 is disposed to cover the surface 122 of the semiconductor device 12. Openings in the insulating layer 21 expose the contact pads 13 and 14 on the surface 122 of the semiconductor device 12.

In FIG. 2, the conductive bar 15 is disposed on the contact pad 13, and the conductive pillars 16 are disposed on respective ones of the contact pads 14. A bottom surface area of the conductive bar 15 is substantially the same as the surface area of the contact pad 13. A bottom surface area of each conductive pillar 16 is substantially the same as the surface area of the respective contact pad 14. In one or more embodiments, the bottom surface area of the conductive bar 15, which contacts the contact pad 13, ranges from approximately 50,000 square micrometers ($\mu m^2$) to approximately 700,000 $\mu m^2$. In one or more embodiments, the bottom surface area of each conductive pillar 16, which contacts the respective contact pad 14, ranges from approximately 100 $\mu m^2$ to approximately 10,000 $\mu m^2$.

The dielectric layer 18 is disposed on the surface 112 of the substrate 11 to cover the semiconductor device 12, and to cover at least portions of the conductive bar 15 and the conductive pillars 16. The dielectric layer 18 includes an opening 181 in which the conductive bar 15 is disposed (such that the conductive bar 15 is exposed from the dielectric layer 18) and openings 182 in which the conductive pillars 16 are disposed (such that the conductive pillars 16 are exposed from the dielectric layer 18). The conductive bar 15 of FIG. 2 is disposed within the opening 181 along the length of the conductive bar 15 (FIG. 1). The conductive pillar 16 of FIG. 2 is disposed within a diameter of the respective opening 182 (FIGS. 1 and 2). As shown in FIGS. 1 and 2, the opening 181 may be relatively greater than each of the openings 182. In one or more embodiments of the present disclosure, a cross-sectional area (FIG. 2) of the opening 181 may be at least approximately ten times greater than a cross-sectional area (FIG. 2) of each of the openings 182, such as at least approximately 15 times greater or at least approximately 20 times greater. The dielectric layer 18 may include, but is not limited to, a resin, such as polyimide (PI), a phenolic resin, a silicone, or another suitable material.

The patterned conductive layer 19 is disposed on the dielectric layer 18. The patterned conductive layer 19 is electrically connected to the conductive bar 15 at the opening 181 and electrically connected to the conductive pillars 16 at the respective openings 182. In one or more embodiments, at least portions of the conductive pillars 16 are integrally formed with the patterned conductive layer 19. In one or more embodiments, at least a portion of the conductive bar 15 is integrally formed with the patterned conductive layer 19. In one or more embodiments, the patterned conductive layer 19 is disposed on the conductive bar 15. The patterned conductive layer 19 may be a redistribution layer (RDL).

Figure 3:
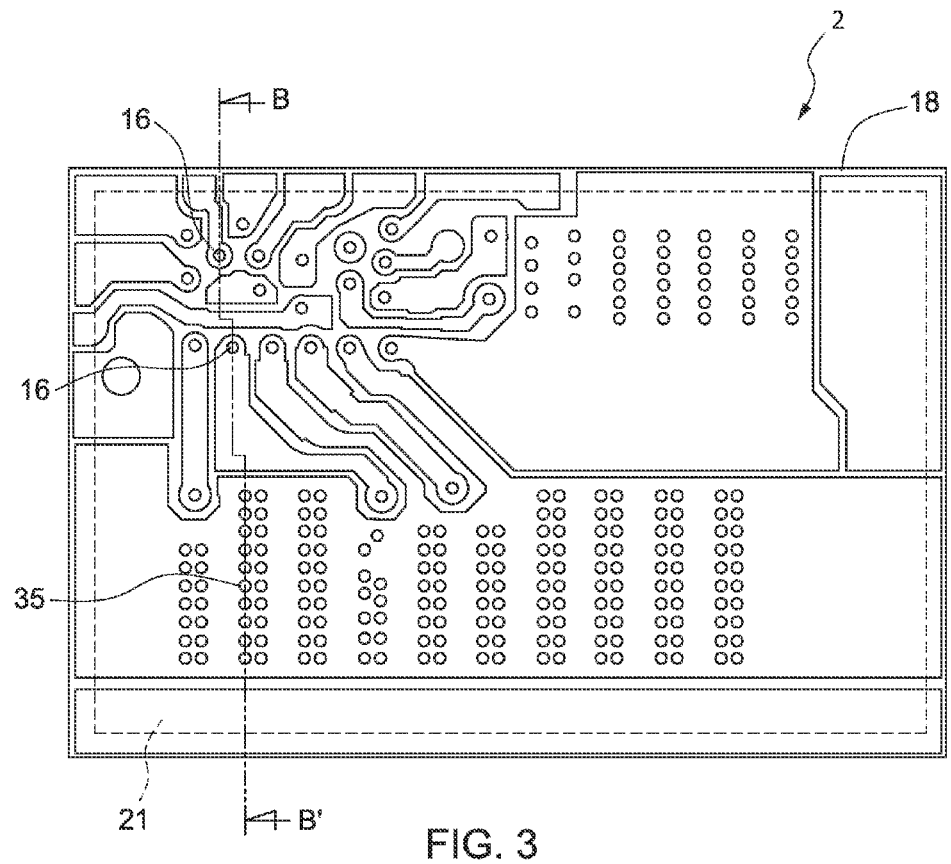
FIG. 3 illustrates a top view of a semiconductor device package in accordance with an embodiment of the present disclosure.
Figure 4:
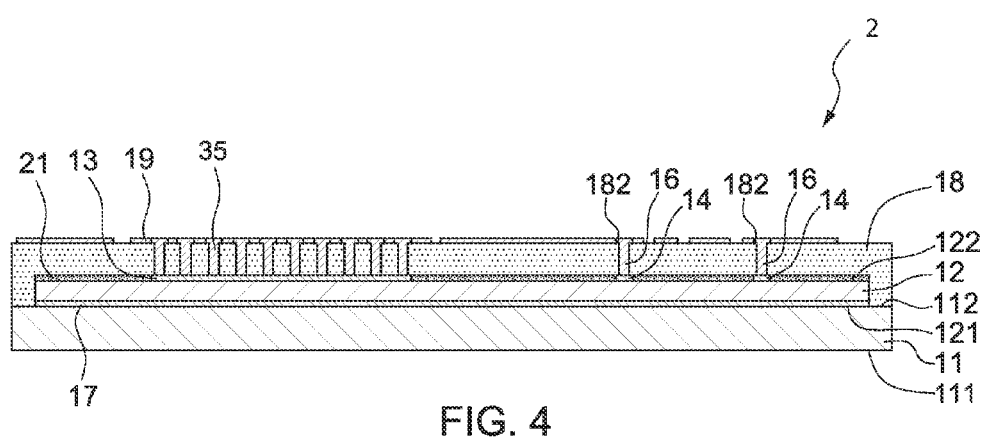
FIG. 4 illustrates a cross-sectional view of the semiconductor device package shown in FIG. 3.

FIG. 3 illustrates a top view of a semiconductor device package 2 in accordance with an embodiment of the present disclosure. FIG. 4 illustrates a cross-sectional view of the semiconductor device package 2 across line BB' of FIG. 3. Referring to FIGS. 3 and 4, the semiconductor device package 2 includes a substrate 11, a semiconductor device 12, contact pads 13, 14, 17, conductive pillars 35, conductive pillars 16, a dielectric layer 18 and a patterned conductive layer 19.

Referring to FIG. 4, the semiconductor device package 2 is similar to the semiconductor device package 1 illustrated and described with reference to FIG. 2, except that the conductive bar 15 is replaced by the conductive pillars 35 arranged within respective arrays, the dielectric layer 18 surrounds the conductive pillars 35, and the patterned conductive layer 19 is disposed on the conductive pillars 35 or is integrally formed with the conductive pillars 35. Each of the conductive pillars 35 may have a structure and dimensions similar to or substantially the same as the structure and dimensions of the conductive pillars 16. In one or more embodiments, a sum of the bottom surface areas of the conductive pillars 35, which contact the contact pad 13, ranges from approximately 100 $\mu m^2$ to approximately 20 $mm^2$. In one or more embodiments, the sum of the bottom surface areas of the conductive pillars 35 within a particular array is at least five times greater than the bottom surface area of any one of the conductive pillars 16, such as approximately seven times or approximately 10 times greater.

Referring back to the description of FIG. 1 and FIG. 2, it can be seen that there is a relatively greater surface area of the conductive bar 15 than the sum of the bottom surface areas of the conductive pillars 35 in FIG. 3 and FIG. 4. The relatively greater surface area of the conductive bar 15 as compared to the sum of the bottom surface areas of the conductive pillars 35 may provide relatively high conductance to carry relatively higher power signals of the semiconductor device 12. To improve an aggregate conductance of the conductive pillars 35, so as to carry higher power signals, additional conductive pillars 35 may be used.

FIGS. 5A-5D illustrate a manufacturing method in accordance with an embodiment of the present disclosure.

Figure 5A:
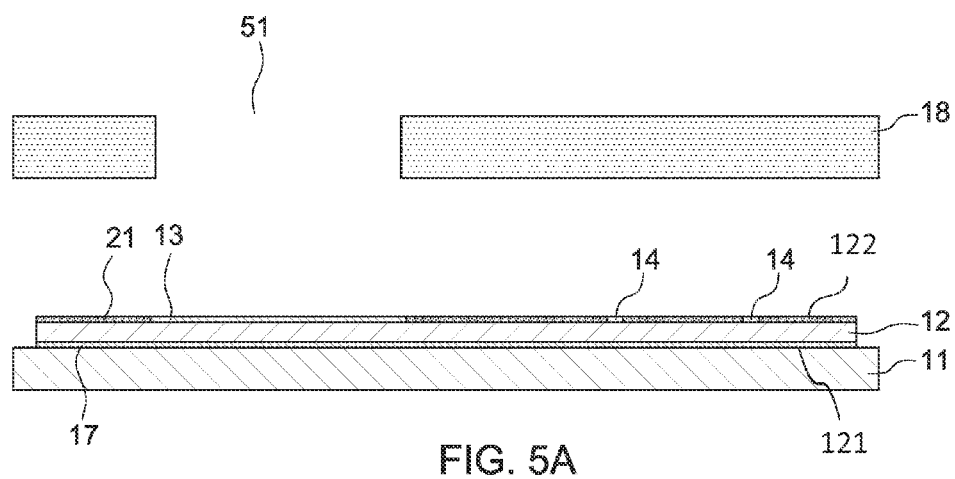
FIG. 5A, FIG. 5B, FIG. 5C, FIG. 5D illustrate a method in accordance with an embodiment of the present disclosure.

Referring to FIG. 5A, a substrate 11 is provided. A semiconductor device 12 is mounted on the substrate 11. The semiconductor device 12 has a surface 122, and a surface 121 opposite the surface 122 and adjacent to the substrate 11. A pad 13 and pads 14 are disposed on the surface 122 of the semiconductor device 12, and a pad 17 is disposed on the surface 121 of the semiconductor device 12.

A dielectric layer 18 is stacked or laminated on the substrate 11 to cover at least portions of the semiconductor device 12. In the embodiment of FIG. 5A, a trench 51 is formed in the dielectric layer 18 prior to the stacking or lamination of the dielectric layer 18 on the substrate 11. The trench 51 may be drilled by a drilling machine, laser or etching techniques. In another embodiment of the present disclosure, the trench 51 may be formed subsequent to the stacking or lamination of the dielectric layer 18 on the substrate 11.

Figure 5B:
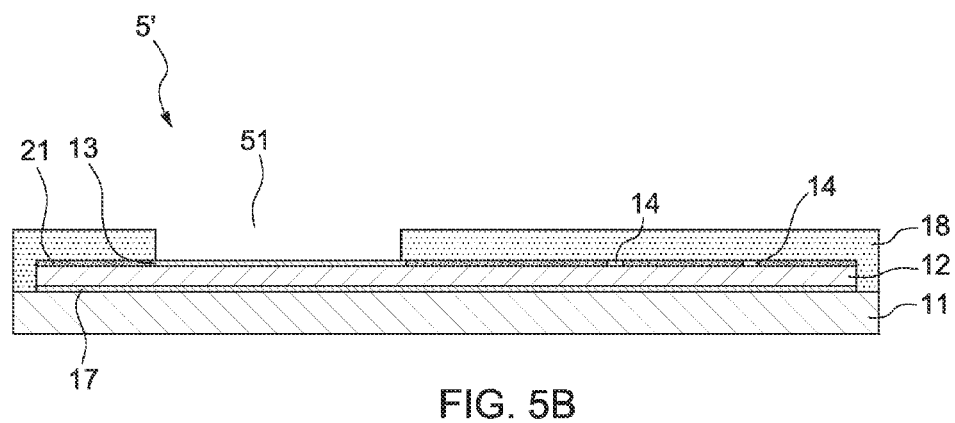

Referring to FIG. 5B, after the dielectric layer 18 is stacked or laminated on the substrate 11 (and after a trench 51 is formed in some embodiments), the pad 13 is exposed by the trench 51.

Figure 5C:
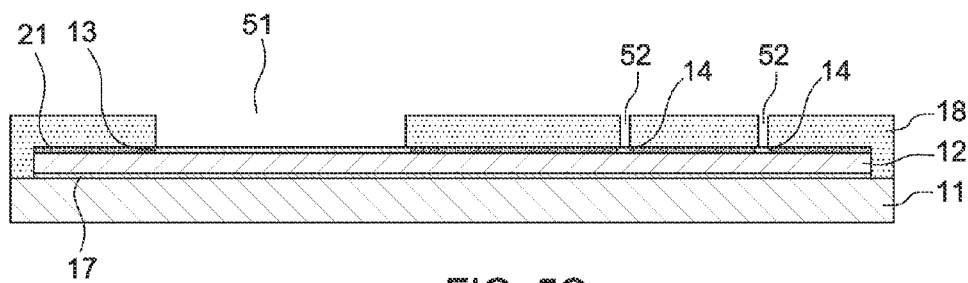

Referring to FIG. 5C, via holes 52 are formed in the dielectric layer 18 to expose the pads 14. A conductive material such as Cu, Al, or Au, or another suitable metal or alloy, is disposed in one or more stages on the dielectric layer 18, in the trench 51, and in the via holes 52 The trench 51 may be substantially fully filled or partially filled, for example, by photo-lithography and a coating, sputtering or plating technique. The via holes 52 may be substantially fully or partially filled concurrently with or separately from the trench 51 by, for example, photo-lithography and a coating, sputtering or plating techniques. The conductive material may further be formed across portions of the dielectric layer 18 concurrently with or separately from filling the trench 51 or the via holes 52, and may be formed as a patterned conductive layer by, for example, photo-lithography and coating, sputtering or plating techniques.

Figure 5D:
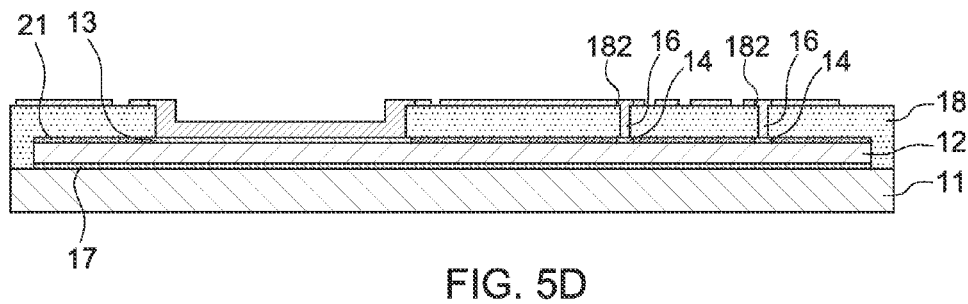

As illustrated in the embodiment of FIG. 5D, the conductive material fills a portion of the trench 51. In other embodiments, the conductive material substantially fully fills the trench 51. In further embodiments, the trench 51 is at least partially filled with a first conductive material and then filled or covered by a second conductive material similar to or different from the first conductive material. Filling the trench 51 in two (or more) stages, such as through the use of an initial plating stage of trench 51, may provide better contact for the conductive pillar 16 since the volume for filling of the trench 51 is much larger than that of the via hole 52.

The manufacturing method of FIGS. 5A-5D may be used to form the semiconductor device package 1 as shown in FIG. 2, which includes the conductive bar 15 in the trench 51, the conductive pillars 16 in the via holes 52 and a patterned conductive layer 19 on the dielectric layer 18.

Referring back to FIG. 2 in comparison with FIG. 4, the conductive bar 15 (FIG. 2) provides relatively better thermal and electrical contact between the semiconductor device 12 and the patterned conductive layer 19 than the conductive pillars 35 (FIG. 4). The conductive bar 15 may also protect the semiconductor device package 1 from electromagnetic interference (EMI). The conductive pillars 35, on the other hand, may contribute less to package warping, and in some embodiments of the present disclosure, may be formed in the same process stages as the conductive pillars 16.

Figure 6:
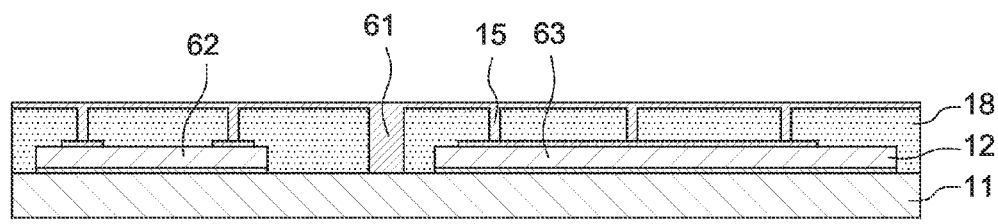
FIG. 6 illustrates a cross-sectional view of a semiconductor device package in accordance with an embodiment of the present disclosure.

FIG. 6 illustrates a cross-sectional view of a semiconductor device package in accordance with an embodiment of the present disclosure, where techniques as described for the manufacturing method of FIGS. 5A-5D are used to form a conductive bar 61 between a semiconductor device 62 and a semiconductor device 63. The conductive bar 61 functions as a shield to mitigate cross talk between the semiconductor device 62 and the semiconductor device 63.

Figure 7:
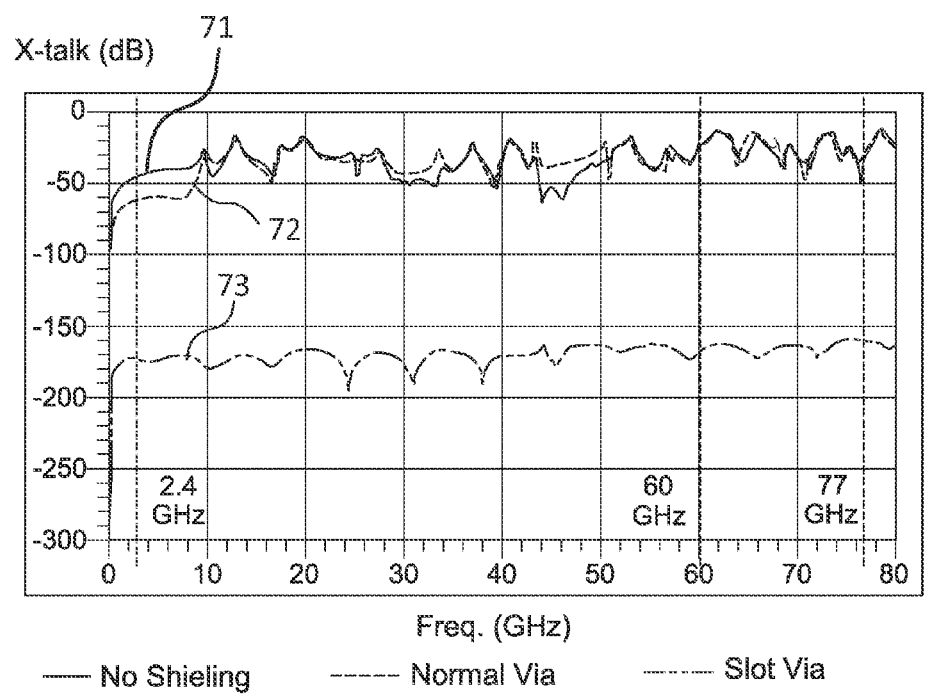
FIG. 7 illustrates results of testing on different semiconductor device packages in accordance with an embodiment of the present disclosure.

FIG. 7 illustrates results of testing on different semiconductor device packages in accordance with an embodiment of the present disclosure. FIG. 7 plots frequency responses of cross talk ("X-talk" in decibel, dB) measured at a single end with a 50 Ohm termination. Line 71 shows the cross talk when there is no shield between a noise source and the single end with 50 Ohm termination. Line 72 shows the cross talk in a device incorporating "normal vias", which are similar to the conductive pillars 35 illustrated and described with reference to FIGS. 3 and 4, arranged to function as a shield between the noise source and the single end with 50 Ohm termination. Line 73 shows the cross talk in a device incorporating a "slot via", which is similar to the conductive bar 15 illustrated and described with reference to FIGS. 1 and 2, arranged to function as a shield between the noise source and the single end with 50 Ohm termination. As shown in FIG. 7, the cross talk of the device with the slot via is 140 dB, which is better than that of the device with normal vias. Therefore, in addition to other benefits, the conductive bar can be used to avoid cross talk or EMI.

As used herein, the singular terms "a," "an," and "the" may include plural referents unless the context clearly dictates otherwise.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

As used herein, the terms "connect," "connected," and "connection" refer to an operational coupling or linking Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of the manufacturing methods described herein. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For another example, the term "substantially the same" can refer to two values with a difference of less than or equal to ±5%, such as less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The construction and arrangement of the packages and methods as shown in the various example embodiments are illustrative only. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the example embodiments without departing from the scope of the present disclosure.

What is claimed is:

1. A semiconductor device package comprising:
    a substrate;
    a semiconductor device disposed on a surface of the substrate, the semiconductor device including a first contact pad and a second contact pad disposed on an upper surface of the semiconductor device;
    a dielectric layer disposed on the surface of the substrate and covering the semiconductor device, and further covering a portion of the first contact pad and a portion of the second contact pad;
    a conductive bar disposed on a remaining portion of the first contact pad exposed by the dielectric layer; and
    a conductive pillar disposed on a remaining portion of the second contact pad exposed by the dielectric layer.

2. The semiconductor device package of claim 1, wherein a surface area of the remaining portion of the first contact pad exposed by the dielectric layer is greater than a surface area of the remaining portion of the second contact pad exposed by the dielectric layer.

3. The semiconductor device package of claim 1, wherein a surface area of the remaining portion of the first contact pad exposed by the dielectric layer is at least ten times greater than a surface area of the remaining portion of the second contact pad exposed by the dielectric layer.

4. The semiconductor device package of claim 1, wherein a bottom surface area of the conductive bar is substantially the same as a surface area of the remaining portion of the first contact pad exposed by the dielectric layer.

5. The semiconductor device package of claim 1, wherein a bottom surface area of the conductive pillar is substantially the same as a surface area of the remaining portion of the second contact pad exposed by the dielectric layer.

6. The semiconductor device package of claim 1 wherein the dielectric layer is further covering the conductive bar and the conductive pillar, and the conductive bar and the conductive pillar are exposed from the dielectric layer;
    further comprising a patterned conductive layer disposed on the dielectric layer, wherein the patterned conductive layer is electrically connected to exposed portions of the conductive bar and the conductive pillar.

7. The semiconductor device package of claim 6, wherein a surface area of the exposed portion of the conductive bar is greater than a surface area of the exposed portion of the conductive pillar.

8. The semiconductor device package of claim 6, wherein a surface area of the exposed portion of the conductive bar is at least ten times greater than a surface area of the exposed portion of the conductive pillar.

9. The semiconductor device package of claim 1, wherein the semiconductor device includes a power transistor including a drain terminal and a source terminal, and the first contact pad is electrically connected to the drain terminal or the source terminal of the power transistor.

10. The semiconductor device package of claim 1, wherein the semiconductor device includes a power transistor including a gate terminal, and the second contact pad is electrically connected to the gate terminal of the power transistor.

11. The semiconductor device package of claim 1, further comprising a third contact pad disposed on a lower surface of the semiconductor device.

12. The semiconductor device package of claim 11, wherein the semiconductor device includes a power transistor including a drain terminal and a source terminal, and the third contact pad is electrically connected to the drain terminal or the source terminal of the power transistor.

13. The semiconductor device package of claim 1, wherein the conductive bar is electrically connected to carry power signals.

14. The semiconductor device package of claim 1, wherein the conductive bar is electrically connected to carry ground signals.

15. The semiconductor device package of claim 1, wherein the conductive bar is configured to carry signals having power greater than 100 Watts.

16. A method of making a semiconductor device package comprising:
    (a) providing a substrate;
    (b) mounting a semiconductor device on the substrate, wherein the semiconductor device comprises a first contact pad and a second contact pad on an upper surface of the semiconductor device, wherein a surface area of the first contact pad is greater than a surface area of the second contact pad;
    (c) disposing a dielectric layer on the substrate to cover the semiconductor device;
    (d) exposing less than an entire surface area of the first contact pad by forming a first hole in the dielectric layer;
    (e) exposing less than an entire surface area of the second contact pad by forming a second hole in the dielectric layer; and
    (f) applying a conductive material over the dielectric layer and filling the first hole and the second hole.

17. The method of claim 16, wherein forming the first hole in the dielectric layer comprises forming a trench in the dielectric layer to expose the first contact pad.

18. The method of claim 17, wherein in (f), applying the conductive material includes filling the trench.

19. The method of claim 16, wherein disposing the dielectric layer in (c) includes (c1) forming a trench in the dielectric layer and (c2) positioning the dielectric layer on the substrate such that the trench exposes the first contact pad.

20. The method of claim 19, wherein in (f), applying the conductive material includes filling the trench.

* * * * *